(12) United States Patent
Offterdinger et al.

(10) Patent No.: US 12,328,819 B2
(45) Date of Patent: Jun. 10, 2025

(54) CONNECTION ELEMENT FOR ELECTRICALLY CONNECTING TWO CIRCUIT CARRIERS

(71) Applicant: Robert Bosch GmbH, Stuttgart (DE)

(72) Inventors: Joerg Offterdinger, Stuttgart (DE); Stefan Huehner, Kusterdingen-Jettenburg (DE)

(73) Assignee: Robert Bosch GmbH, Stuttgart (DE)

( * ) Notice: Subject to any disclaimer, the term of this patent is extended or adjusted under 35 U.S.C. 154(b) by 158 days.

(21) Appl. No.: 18/248,351

(22) PCT Filed: Sep. 13, 2021

(86) PCT No.: PCT/EP2021/075098
§ 371 (c)(1),
(2) Date: Apr. 7, 2023

(87) PCT Pub. No.: WO2022/078683
PCT Pub. Date: Apr. 21, 2022

(65) Prior Publication Data
US 2023/0380064 A1    Nov. 23, 2023

(30) Foreign Application Priority Data
Oct. 14, 2020    (DE) .................. 10 2020 212 934.7

(51) Int. Cl.
*H05K 1/14*    (2006.01)
(52) U.S. Cl.
CPC ....... *H05K 1/144* (2013.01); *H05K 2201/042* (2013.01); *H05K 2201/10265* (2013.01);
(Continued)

(58) Field of Classification Search
CPC ............ H05K 1/144; H05K 2201/042; H05K 2201/10265; H05K 2201/10303; H05K 2201/1059; H05K 2201/10984
(Continued)

(56) References Cited

U.S. PATENT DOCUMENTS 5,581,879 A * 12/1996 Tsuji .................. H01R 43/01
29/33 M
2005/0148877 A1* 7/2005 Guo .................. B06B 1/0629
600/459
(Continued)

FOREIGN PATENT DOCUMENTS

| DE | 102004041207 A1 | 3/2006 |
|---|---|---|
| DE | 102014109220 A1 | 1/2016 |
| EP | 3404774 A1 | 11/2018 |

OTHER PUBLICATIONS

Translation of International Search Report for Application No. PCT/EP2021/075098 dated Jan. 7, 2022 (2 pages).

*Primary Examiner* — Andargie M Aychillhum
(74) *Attorney, Agent, or Firm* — Michael Best & Friedrich LLP

(57) ABSTRACT

A connection element for electrically connecting a circuit carrier to another circuit carrier includes at least one solder connection for soldering onto the surface of the circuit carrier and a connection pin, which is electrically connected to the solder connection, for inserting into the other circuit carrier. The connection element has a holding body and a contact element which is connected to the holding body and which is designed to be elastic. The contact element has an end section, the solder connection being formed on the end section. The connection element has a locking element which is connected to the connection element in a movable manner back and forth between a locking position and a release position. The locking element is designed to limit the (Continued)

displacement of the contact element in the locking position and release an elastic movement of the contact element in the release position.

16 Claims, 2 Drawing Sheets

(52) U.S. Cl.
    CPC ............ *H05K 2201/10303* (2013.01); *H05K 2201/1059* (2013.01); *H05K 2201/10984* (2013.01)

(58) Field of Classification Search
    USPC .......................................... 361/803
    See application file for complete search history.

(56) References Cited

U.S. PATENT DOCUMENTS

| | | | | |
|---|---|---|---|---|
| 2011/0222282 A1* | 9/2011 | Preuschl | ................... | F21K 9/90 29/838 |
| 2012/0081864 A1* | 4/2012 | Sakurai | ............. | H01L 23/49827 361/753 |
| 2012/0295490 A1* | 11/2012 | Schneider | .............. | H01R 12/91 29/423 |
| 2017/0232566 A1* | 8/2017 | Babel | .................. | B23B 31/0261 279/20 |

* cited by examiner

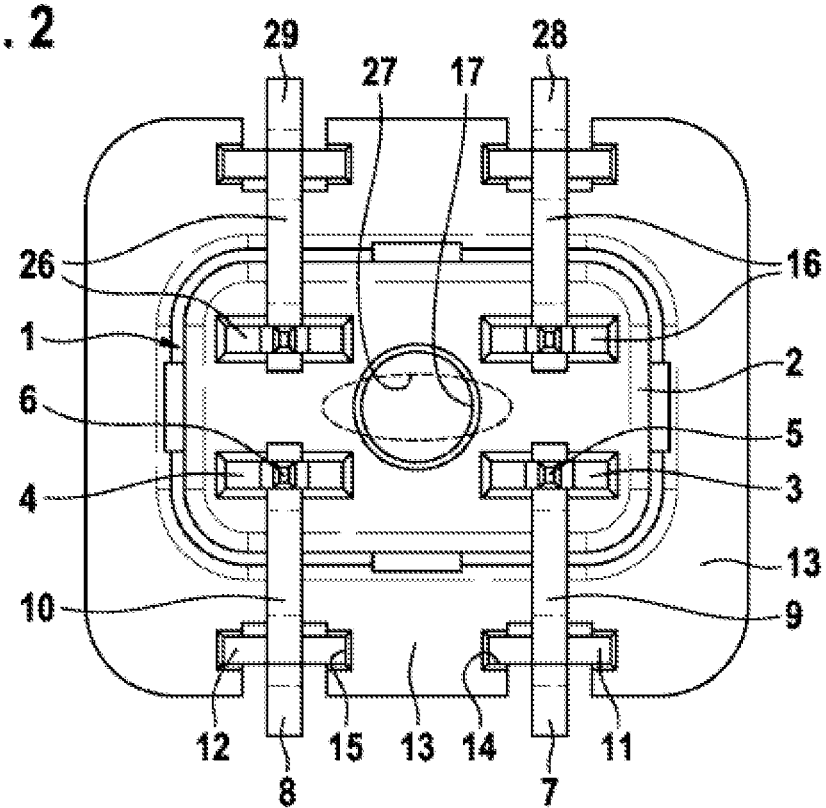
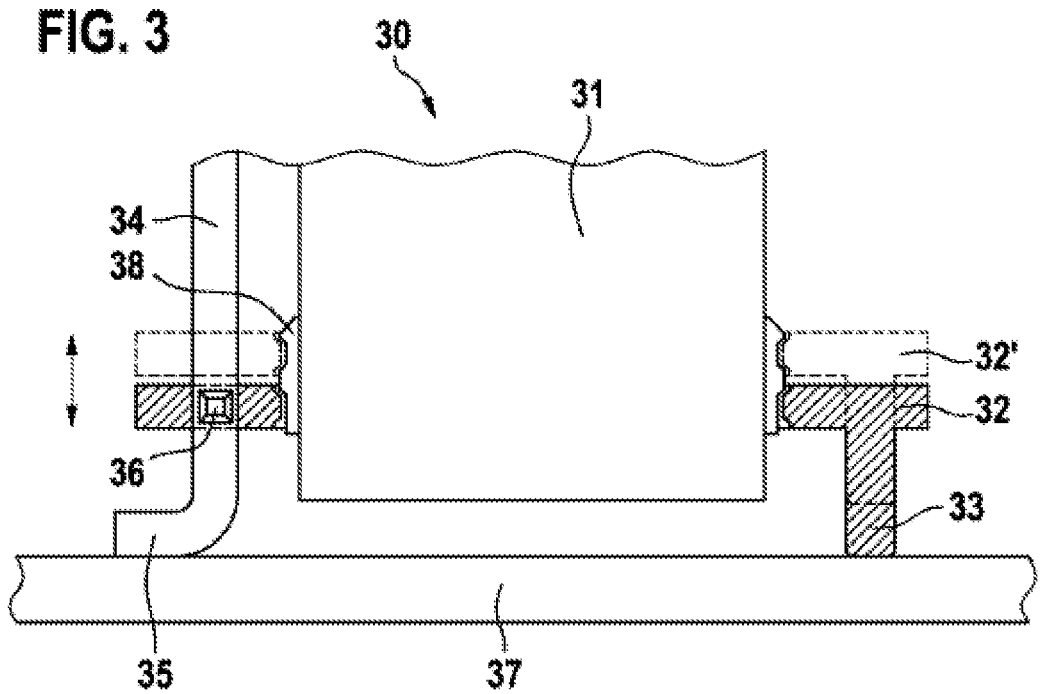

CONNECTION ELEMENT FOR ELECTRICALLY CONNECTING TWO CIRCUIT CARRIERS

BACKGROUND

The invention relates to a connection element for electrically connecting a circuit carrier to another circuit carrier. The connection element has at least one solder connection for soldering onto the surface of the circuit carrier and a THT connection (THT=Through-Hole-Technology), in particular a connection pin, which is electrically connected to the solder connection for inserting into the other circuit carrier.

A printed circuit board connection element is known from DE 10 2014 109 220 A1, which is configured so as to electrically and/or mechanically connect two printed circuit boards and has solderable SMD terminal faces and/or plug-in THT wire terminals, wherein the printed circuit board connection element has a carrier body and a support body attached to the carrier body for being supporting on the printed circuit board, such that a mechanical unloading of the SMD terminal faces or the THT wire terminals can be caused during the pressing operation.

SUMMARY

According to the invention, the connection element has a holding body, in particular a plastic body, and a contact element which is connected to the holding body and which is designed to be elastic. The contact element has an end section, wherein the solder connection is formed on the end section. The connection element has a locking element which is connected to the connection element in a movable manner back and forth between a locking position and a release position. The locking element is designed to limit the displacement of the contact element in the locking position and release an elastic movement of the contact element in the release position. Advantageously, the connection element can thus be placed on the circuit carrier configured for surface soldering in the locking position of the locking element and soldered to the circuit carrier. The solder connections can precisely meet the surface-soldered contact surfaces of the circuit carrier insofar as they are held in a predetermined position by means of the locking element, in particular while maintaining predetermined distances from one another. After the surface soldering, the locking element can be moved into the release position and can thus intercept the contact element for elastic interception of movements, in particular heavy movements, by the movement of the two circuit carriers.

In a preferred embodiment, the locking element is formed by a frame enclosing the holding body, wherein the frame is configured so as to encompass and hold a longitudinal section of the contact element in the locking position. Advantageously, the contact element, which is formed by, for example, a longitudinally extending wire or a punched lattice, can be held by means of the locking element in a predetermined position relative to the holding body, in particular at a predetermined distance, radially spaced apart from the holding element.

The plastic body is preferably formed from polyamide, poly-ether-ether-ketone, PPS (polypropylene sulfide), or LCP (LCP=liquid-crystal polymer). Advantageously, the plastic body can withstand such high temperatures when soldering the connection element.

In a preferred embodiment, the connection element is configured so as to be placed on the circuit carrier for surface soldering. Preferably, the contact element has a solder foot forming the solder connection for this purpose, which is formed at an end section of the contact element, in particular extending at an angle from the contact element. Advantageously, the solder foot can thus be configured in a cost-effective manner on the contact element, in particular molded to the contact element.

In a preferred embodiment, the contact element is formed by an in particular punched contact wire, which has the solder foot at an end section facing the circuit carrier. The contact element preferably has a THT connection, in particular a connection pin or press-in contact, at an end opposite to the solder foot. The press-in contact is configured so as to be pressed into an in particular metalized breakthrough of a printed circuit board and to mechanically contact the printed circuit board there in the breakthrough, holding it therein electrically.

Advantageously, the two circuit carriers can thus be connected to one another in a cost-effective manner by means of the connection element. In a preferred embodiment, on the longitudinal section configured for being locked, the contact element has a protrusion region, and the locking element has a recess for the protrusion region, which recess corresponds in particular to the protrusion region. The locking element is configured so as to hold the contact element on the protrusion region upon insertion into the recess in the locking position. The locking element is further preferably configured so as to release the contact element on the protrusion region for movement in the released position. Advantageously, a locking of the contact element can thus be established in a cost-effective manner.

In a preferred embodiment, the contact element has a larger diameter on the longitudinal section configured for being locked, in particular on the protrusion region, than on an adjacent section configured for being released. Advantageously, the longitudinal section configured for being locked can be produced in a cost-effective manner when punching the contact element out of a sheet metal piece.

In a preferred embodiment, the locking element is configured so as to encompass the contact element on a longitudinal section, wherein the longitudinal section having the smaller diameter is arranged in the release position in the recess, in which the protrusion region is arranged in the locking position.

Advantageously, the locking element can be configured so as to be moved back and forth along a longitudinal extension of the connection element, in particular transversely to a flat extension of the circuit carrier configured for surface soldering.

In a further embodiment, the locking element is configured so as to be moved back and forth in a parallel plane to the surface soldering. The locking element, which is formed, for example, by a U-shaped or O-shaped frame, which encloses the connection element, in particular the holding body, can thus comprise a breakthrough, which is elongated, for example, and is configured so as to encompass and hold the contact element at a constriction.

In a preferred embodiment, the contact element is L-shaped or T-shaped at the protrusion region. Advantageously, the protrusion region can thus be formed in a cost-effective manner by punching out of a sheet metal piece onto the contact element.

In a preferred embodiment, the THT connection is configured as a press-in contact. Preferably, the press-in contact is configured so as to be held in a breakthrough of the other circuit carrier, in particular, radially elastically outwards. The contact element preferably extends beyond an end section of the holding body that faces the circuit carrier, so that the connection element can elastically yield upon pressing of the other circuit carrier onto the connection element, so that the end section forms an end stop limiting the displacement caused by the yielding. Advantageously, the end stop can thus be formed by the holding body itself. Thus, the holding body advantageously does not need to have any further arms or stop elements which radially repel from the holding body and which limit the displacement during the press-in.

In a preferred embodiment, the locking element has at least one standing foot or standing leg molded to the locking element and configured so as to extend in the locking position up to a plane formed by the circuit carrier, in particular the circuit carrier configured for the surface soldering, such that the connection element together with the solder foot and the at least one pedestal can stand together on to the circuit carrier, in particular without being held. Advantageously, the locking element can thus form a further support body, which can secure the connection element, in particular the solder connection of the solder foot towards the circuit carrier, when pressing the other circuit carrier. Thus, a connection element with only one or only a few contact elements can be formed, which can establish a secure stand on the circuit carrier configured for surface soldering.

In a preferred embodiment, the connection element is configured so as to hold the locking element in the release position such that the locking element is positively locked in a catching manner or additionally frictionally locked to the holding body. Advantageously, the locking element thus cannot create rattling noises in the release position. In a preferred embodiment, the locking element is molded to the connection element and is connected by means of the connection element by means of a desired point of separation or a desired point of break. Advantageously, the locking element can thus be released from the connection element at the desired point of separation or the desired breaking point by means of a pressing tool and moved into the locking position.

The locking element and the connection element can be configured so as to detachably or non-detachably catch the locking element in the release position. Thus, after soldering with the circuit carrier configured for surface soldering, the locking element can be securely held in the released position and thus does not create any rattling noises.

In a preferred embodiment, the locking element is configured so as to be moved along a longitudinal extension of the connection element that is transverse to the contact plane, in particular the plane of the circuit carrier configured for surface soldering. Advantageously, the locking element can thus be moved back and forth between the release position and/or the locking position by means of a pressing or punching tool.

In a preferred embodiment, the connection element has an opening for receiving a joining aid, in particular a centering mandrel, which has a longitudinally-extended opening shape, in particular an opening surface. Advantageously, the connection element can be aligned rotationally around the longitudinal extension of the connection element by means of the centering pin so that the contact elements, in particular the press-in contacts of the connection element, align with the breakthroughs of the circuit carrier to be connected. Advantageously, the connection element can be easily assembled in this way with the other circuit carrier.

Preferably, the opening is oval, elliptical, rectangular, or semicircular or semi-elliptical. Advantageously, a rotation of the connection element into the joining position can be achieved, in which the contact elements can be easily pressed in.

In a further embodiment, the connection element has two in particular circular or oval openings spaced apart from one another for receiving two joining aids, in particular centering mandrels, which are arranged on the connection element such that the connection element can be rotated about a longitudinal axis, in particular transverse to a circuit carrier plane, when joining with the other circuit carrier. Advantageously, the contact elements can thus precisely align with corresponding breakthroughs in the other circuit carrier.

The invention also relates to a contact system having a locking element of the aforementioned type. The contact system comprises the connection element and the two circuit carriers electrically and mechanically connected to the connection element, in particular a circuit carrier and another circuit carrier.

The invention also relates to a control unit for a motor vehicle, an inverter, a DC-DC converter, or a charger having a contact system of the aforementioned type. In the contact system, the circuit carrier configured for surface soldering forms a power component, in particular an inverter, comprising semiconductor switch half-bridges. The other circuit carrier forms a control device for controlling the inverter, in particular the semiconductor switches of the inverter.

BRIEF DESCRIPTION OF THE DRAWINGS

The invention will now be described in the following with reference to figures and embodiment examples. Further advantageous design variants will emerge from a combination of the features described in the figures and in the dependent claims.

FIG. 2 shows the connection element shown in FIG. 1 in an aerial view;

FIG. 3 shows a variant for a connection element, in which a locking element that encompasses a holding body of the connection element can fix the contact elements and can be supported against the circuit carrier.

DETAILED DESCRIPTION

Figure 1:
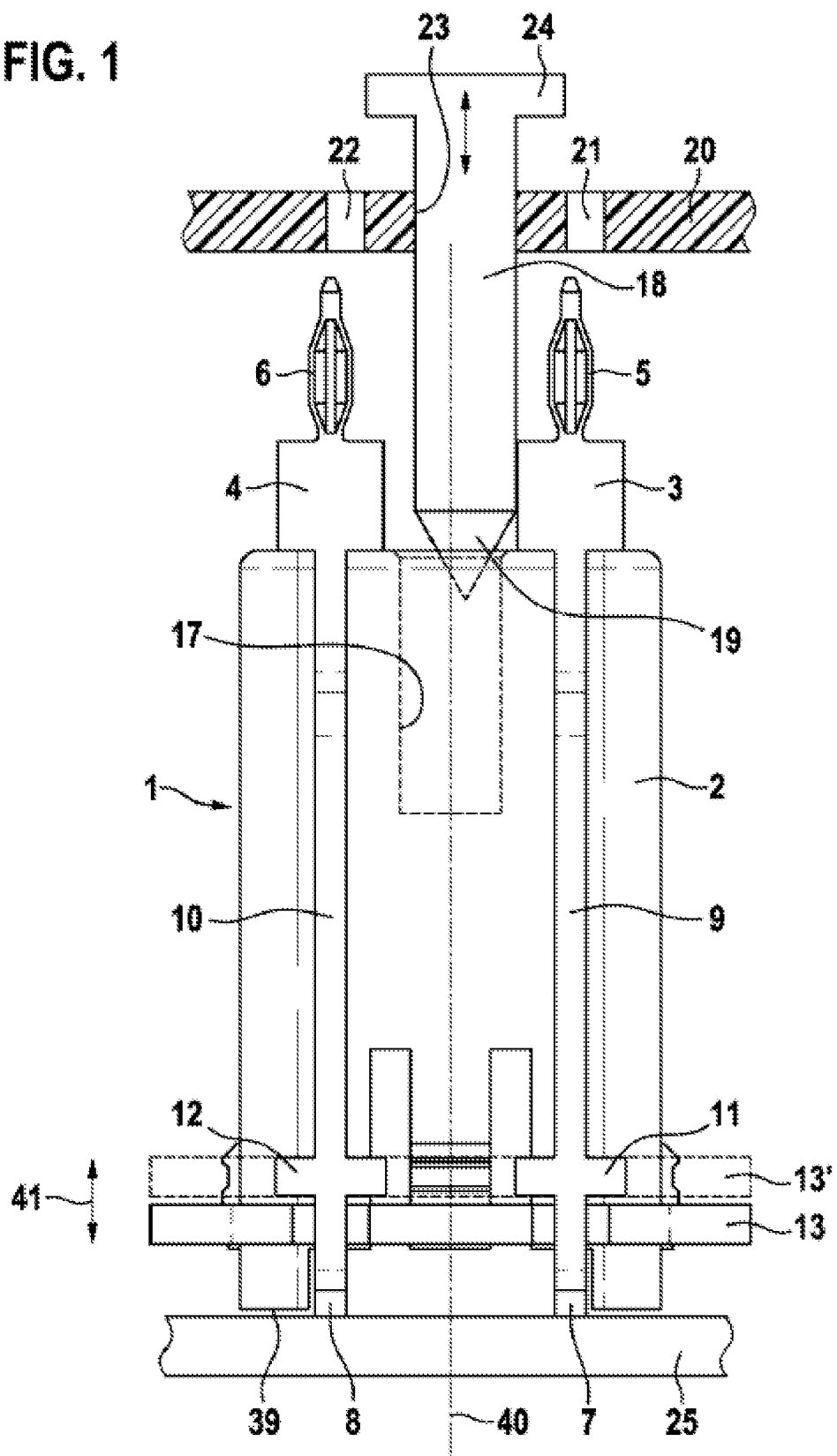
FIG. 1 shows a connection element for electrically connecting a circuit carrier to another circuit carrier, wherein the connection element has a holding body and contact elements held therein for electrically connecting the circuit carriers, and the contact elements are each configured for surface soldering to the circuit carrier and for press-in connection to the other circuit carrier.

FIG. 1 shows a connection element for electrically connecting two circuit carriers. The connection element 1 has a holding body, which is configured so as to hold at least one contact element, in this embodiment four contact elements, of which a contact element 3 and a contact element 4 are shown. Each of the contact elements has a solder foot for soldering to a circuit carrier 25, and a press-in contact for pressing into another circuit carrier 20.

The contact elements each comprise a connection section which is elastic and which electrically connects the pressing section and the solder foot to each other. The contact element 3 has a press-in contact 5 and a solder foot 7, wherein the press-in contact 5 and the solder foot 7 are electrically conductively connected to each other by means of the connection section 9. The press-in contact 4 has a press-in section 6, which is electrically connected to the solder foot 8 by means of a connection section 10, which is in particular elastic. The press-in contacts 3 and 4 are configured as a stamped sheet part, for example, an in particular punched lattice or lead frames. The press-in contacts 5 and 6 are each configured so as to be pressed into a breakthrough of the other circuit carrier, namely the breakthrough 21 and the breakthrough 22. The other circuit carrier 20 can thus be electrically connected to the circuit carrier 25 by means of the contact elements 3 and 4.

The connection element 1 is configured so as to be placed on the circuit carrier 25. In this design example, the connection element 1 is configured so as to be placed on the circuit carrier 25 with the solder feet, in particular the solder feet 7 and 8. An end region 39 of the holding body 2 is spaced apart from the circuit carrier 25.

The connection element 1 has a locking element 13, which is configured so as to be moved from a locking position 13' into a release position, in particular indicated by an arrow 41. The locking element 13 is configured so as to secure the contact elements 3 and 4 in the region of the solder foot, in particular the solder foot 7 and the solder foot 8, in the locking position 13' in a positive manner, and to secure a trapping of the press-in contacts 5 and 6 in the respective breakthrough in the other circuit carrier 20. For this purpose, the locking element 13 has at least one recess—shown in FIG. 2 in particular—which is configured so as to hold a T-shaped protrusion region 11 of the press-in contact 3 and a T-shaped protrusion region 12 of the press-in contact 4 in the respective recess. The locking element 13 has a separate recess for each protrusion region. In this embodiment example, the locking element 13 is formed as a plate configured circumferentially, in particular annularly, around the holding body 2. The locking element 13 is configured so as to be moved back and forth along a longitudinal extension 40 of the connection element 1, wherein the longitudinal extension 40 is transverse to a flat extension and thus transverse to the circuit carrier 20, corresponding to a surface normal.

In this embodiment example, the connection element 1 is configured so as to mechanically and electrically connect the circuit carriers, in particular the circuit carrier 25 and the other circuit carrier 20 spaced apart from one another in parallel.

For example, the circuit carrier 25 can be slightly bent, in particular convex or concave, or the press-in contacts have a lateral offset in relation to the circuit carrier 20, for example caused by tolerances. This causes the connection element 1, which is soldered to the circuit carrier 25, to be slightly oblique in relation to the other circuit carrier 20, so that—as shown in FIG. 1—the press-in contacts 5 and 6 do not exactly align with the breakthroughs 21 and 22 of the other circuit carrier 20. When the circuit carriers 25 and 20 are pressed together, as shown in FIG. 1, the press-in contacts 5 and 6 would hit the other circuit carrier 20 and miss the breakthroughs 21 and 22, respectively, and as a result, bend.

In this embodiment example, the other circuit carrier 20 has a joining aid breakthrough 23, which is configured so as to receive a joining aid 18. The joining aid 18 is longitudinally extended in this embodiment example and has a diameter and a cross-sectional shape corresponding to the opening 23 of the other circuit carrier 20. In this embodiment example, the breakthrough 23 is configured between the breakthroughs 21 and 22 for the press-in contacts 5 and 6, respectively.

The joining aid 18 has a tapered end section 19, which is configured to be pointed in a tapering manner towards the end. The tapered end section 19, which in this embodiment example is formed as a pointed cone, can be inserted with its tapered tip into a recess 17 formed in the holding body 2. In particular, the breakthrough diameter of the recess 17 corresponds to the diameter of the joining aid 18 on a longitudinal section of the joining aid 18, which connects to the tapered end section 19. In this way, the joining aid 18 can stick into the recess 17, by pressing down on the other circuit carrier 20, being supported on the other circuit carrier 20 by means of a compression shoulder 24, and thus correct the holding body 2 of the connection element 1 with respect to its orientation and position in relation to the other circuit carrier 20, such that the press-in contacts 5 and 6 can enter the respective breakthroughs 21 and 22 in an aligned manner when connecting the two circuit carriers.

The contact elements 3 and 4 can elastically tap the movement of the connection element 1 generated in this way on the elastically configured connection sections 9 and 10, so that the solder connection of the solder foot 7 and 8 cannot be released with the circuit carrier 25. The connection sections 9 and 10 are longitudinally extended and angled in this embodiment. The connection sections 9 and 10 can have at least one meandering loop, such that the contact elements 3 and 4 in the longitudinal extension 40 of the connection element can elastically compensate for the position correction carried out by means of the joining aid 18.

The locking element 13 can be moved from the locking position 13' into the release position shown in FIG. 1, as indicated by arrow 41, after the soldering of the connection element 1 to the circuit carrier 25, and thus before the connection of the connection element 1 to the other circuit carrier 20, so that the connection sections 9 and 10 can be freely elastic.

FIG. 2 shows the connection element 1 already shown in FIG. 1 in an aerial view of the press-in contacts 5 and 6. The opening 17 in the holding body 2 is also visible, which is configured so as to receive the joining aid 18 at least on a longitudinal section, which connects to the tapered end section 19, in particular in a form-fitting manner.

FIG. 2 also shows the T-shaped protrusion regions 11 and 12, which are respectively arranged in a corresponding recess 14 or 15 of the locking element 13, and are held there in a positive and/or friction-locked manner.

In this design example, the connection element 1 has two further contact elements 16 and 26, which, like the contact elements 3 and 4, are held in the holding body 2 on at least a longitudinal section. The contact elements can be embedded in the holding body 2, in particular injected, or inserted into the holding body 2 and locked therein.

In this design example, the contact elements 3, 4, 16, and 26 are arranged regularly in a contact plane which extends transversely to the longitudinal extension 40 of the connection element 1, in particular in a rectangle. The connection element 1 can thus be placed on the circuit carrier 25 with the solder feet 7 and 8 of the contact elements 3 and 4 and with the solder feet 28 and 29 of the contact elements 16 and 26, respectively, and can stand there securely.

FIG. 2 also shows a variant for the connection element 1 shown in FIG. 1. In this variant, in which an opening 27 shown in dashed form is longitudinally extended and oval in this embodiment example, an oval, in particular elliptical, joining aid formed correspondingly in the cross-section of the oval opening 27, can engage with the oval, in particular elliptical, opening 27. Advantageously, even with a rotational twisting around the longitudinal extension 40 of the connection element 1, the holding body 2 can thus be corrected in terms of position by means of the joining aid with the longitudinally extended cross-section such that the press-in contacts align exactly with the corresponding breakthroughs in the other circuit carrier 20.

FIG. 3 shows an embodiment example for a variant of the connection element 1 shown in FIGS. 1 and 2. FIG. 3 shows a connection element 30, which has a holding body 31.

In this embodiment example, the connection element 30 has a locking element 32, which annularly encloses the holding body 31 at least along a circumferential section. In this embodiment example, the connection element 30 has only one contact element 34, such that the connection element 30 cannot stand alone on a circuit carrier 37 with a solder foot 35 formed on the contact element 34.

The locking element 32 can be held in a positive and/or friction-locked manner in a release position 32' with a catching lug 38 molded onto the holding body 31. The locking element 32 can be moved out of the release position 32' towards the circuit carrier 37 such that a protrusion 36 molded to the contact element 34 can be held by the locking element 32 in a positive and/or friction locked manner within a corresponding recess of the locking element 32.

In this embodiment, the locking element 32 has an additional standing leg 33 extending transversely to a flat extension of the locking element 32, which can secure a standing of the connection element 30 on the circuit carrier 37. For example, the connection element 30 has only one contact element, only two contact elements, or only three contact elements, such that with the only one contact element or only two contact elements no independent standing of the connection element 30 can be secured on the circuit carrier 37. By sliding the locking element 32 towards the circuit carrier 37, the additional standing leg 33 can provide a secure standing of the connection element 30 on the circuit carrier 37. The locking element 32 can remain on the circuit carrier 37 after the soldering of the solder foot 35 to the circuit carrier 37 in order to secure the mechanical unloading of the solder connection between the solder foot 35 and the circuit carrier 37, or be moved back into release position 32' so that the contact element 34 is fully freely elastic.

What is claimed is:

1. A connection element for electrically connecting a circuit carrier to another circuit carrier,
   wherein the connection element has a solder connection for soldering onto a surface of the circuit carrier and a THT connection, which is electrically connected to the solder connection for inserting into the other circuit carrier,
   wherein the connection element has a holding body and a contact element which is connected to the holding body and which is configured to be elastic, wherein the contact element has the solder connection on an end section, and the connection element has a locking element -which is connected to the connection element in a movable manner back and forth between a locking position and a release position, which locking element is configured to limit a displacement of the contact element in the locking position and release an elastic movement of the contact element in the release position,
   wherein the locking element is formed by a frame enclosing the holding body, which frame is configured to encompass and hold a longitudinal section of the contact element in the locking position.

2. The connection element according to claim 1, wherein the connection element is configured to be placed on the circuit carrier for surface soldering, and the contact element has a solder foot forming the solder connection, which is formed at an end section of the contact element.

3. The connection element according to claim 2, wherein the contact element is formed by a punched contact wire, which has the solder foot at an end section facing the circuit carrier and has a through-hole technology connection at an end opposite the solder foot.

4. The connection element according to claim 2, wherein, the locking element has at least one standing foot or standing leg molded to the locking element and configured to extend in the locking position up to a plane formed by the circuit carrier, such that the connection element together with the solder foot and the at least one standing foot can stand together on to the circuit carrier.

5. The connection element according to claim 4, wherein the connection element together with the solder foot and the at least one standing foot can stand together on to the circuit carrier without being held.

6. The connection element according to claim 2, wherein the solder connection extends at an angle from the contact element.

7. The connection element according to claim 3, wherein the through-hole technology connection is a press-in contact.

8. The connection element according to claim 1, wherein, on the longitudinal section configured for being locked, the contact element has a protrusion region, and the locking element has a recess for the protrusion region, which recess corresponds to the protrusion region and is configured to hold the contact element on the protrusion region upon insertion into the recess in the locking position.

9. The connection element according to claim 8, wherein the contact element has a larger diameter on the longitudinal section configured for being locked than on an adjacent section configured for being released.

10. The connection element according to claim 8 wherein, the contact element is formed in an L-shaped or T-shaped manner at the protrusion region.

11. The connection element according to claim 1, wherein, the THT connection is configured as a press-in contact and the contact element extends beyond an end section of the holding body that faces the circuit carrier, so that the connection element can elastically yield upon pressing of another circuit carrier onto the connection element, so that the end section forms an end stop limiting displacement caused by the yielding.

12. The connection element according to claim 1, wherein the connection element is configured to hold the locking element in the release position such that the locking element is positively locked in a catching manner or additionally frictionally locked to the holding body.

13. The connection element according to claim 1, wherein the connection element is configured to be moved along a longitudinal extension of the connection element extending transversely to a contact plane.

14. The connection element according to claim 1, wherein the connection element has an opening for insertion of a centering mandrel, wherein the opening has a longitudinally extended opening shape.

15. The connection element according to claim 1, wherein the THT connection is a connection pin.

16. The connection element according to claim 1, wherein the holding body is a plastic body.

* * * * *